(12) United States Patent
Scheiermann

(10) Patent No.: US 10,145,867 B2
(45) Date of Patent: Dec. 4, 2018

(54) DEVICE AND METHOD FOR DETECTING A STATE

(71) Applicant: Robert Bosch GmbH, Stuttgart (DE)

(72) Inventor: Sergej Scheiermann, Stuttgart (DE)

(73) Assignee: Robert Bosch GMBH, Stuttgart (DE)

( * ) Notice: Subject to any disclaimer, the term of this patent is extended or adjusted under 35 U.S.C. 154(b) by 10 days.

(21) Appl. No.: 15/023,316

(22) PCT Filed: Aug. 29, 2014

(86) PCT No.: PCT/EP2014/068426
§ 371 (c)(1),
(2) Date: Mar. 18, 2016

(87) PCT Pub. No.: WO2015/051948
PCT Pub. Date: Apr. 16, 2015

(65) Prior Publication Data
US 2016/0238638 A1    Aug. 18, 2016

(30) Foreign Application Priority Data

Oct. 10, 2013 (DE) .......................... 10 2013 220 403

(51) Int. Cl.
*G01R 19/15* (2006.01)
*G01R 31/28* (2006.01)
(Continued)

(52) U.S. Cl.
CPC ............. *G01R 19/15* (2013.01); *G01R 15/18* (2013.01); *G01R 31/2825* (2013.01); *G01R 31/40* (2013.01)

(58) Field of Classification Search
CPC . G01R 1/20; G01R 1/22; G01R 27/26; G01R 27/2611; G01R 29/20;
(Continued)

(56) References Cited

U.S. PATENT DOCUMENTS

2003/0062886 A1* 4/2003 Hastings ................. G01R 1/02
324/117 H
2006/0082356 A1* 4/2006 Zhang .................. G01R 15/181
324/117 R
(Continued)

FOREIGN PATENT DOCUMENTS

DE    102005025541    12/2006
DE    102008039450    3/2010
(Continued)

OTHER PUBLICATIONS

International Search Report for PCT/EP2014/068426, dated Nov. 25, 2014.
(Continued)

Primary Examiner — Tung X Nguyen
Assistant Examiner — Robert P Alejnikov, Jr.
(74) Attorney, Agent, or Firm — Norton Rose Fulbright US LLP; Gerard Messina

(57) ABSTRACT

A device and a method for detecting a state of an electrical device. A magnetic field is thereby measured by a magnetic field sensor along an electrical power supply cable of the electrical device via which the electrical device is supplied with power; a magnetic field is thereby measured by a magnetic field sensor, and the magnetic field measured in this manner is compared with previously determined reference values in order to determine the operating state of the electrical device. The process of determining the reference values may thereby be individually adapted in an upstream calibration process to the electrical device to be monitored.

15 Claims, 2 Drawing Sheets

(51) Int. Cl.
*G01R 15/18* (2006.01)
*G01R 31/40* (2014.01)

(58) Field of Classification Search
CPC .............. G01R 31/027; G01R 19/165; G01R 19/16566; G01R 19/16576
USPC ................................. 324/127, 649, 656, 726
See application file for complete search history.

(56) References Cited

U.S. PATENT DOCUMENTS

| | | | |
|---|---|---|---|
| 2007/0108988 A1* | 5/2007 | Konno | G01R 31/2825 324/529 |
| 2008/0076437 A1 | 3/2008 | Wilson et al. | |
| 2009/0315539 A1* | 12/2009 | Helwig | G01V 3/083 324/149 |
| 2009/0315566 A1* | 12/2009 | Thiim | G01R 19/252 324/551 |
| 2011/0291678 A1* | 12/2011 | Pflum | G01F 15/063 324/705 |
| 2012/0169328 A1* | 7/2012 | Williams | G01R 15/20 324/251 |

FOREIGN PATENT DOCUMENTS

| | | | | |
|---|---|---|---|---|
| DE | 102010043394 | | 5/2012 | |
| EP | 0858143 | A2 | 8/1998 | |
| EP | 1039359 | | 9/2000 | |
| EP | 2278344 | | 1/2011 | |
| EP | 2278344 | A2 * | 1/2011 | ........... G01R 15/207 |
| JP | 2001004672 | A | 1/2001 | |
| JP | 2004272771 | | 9/2004 | |

OTHER PUBLICATIONS

Mostafa Uddin "Magno Tricorder: What You Need to Do Before Leaving Home" UbiComp'12, Sep. 5-8, 2012.

* cited by examiner

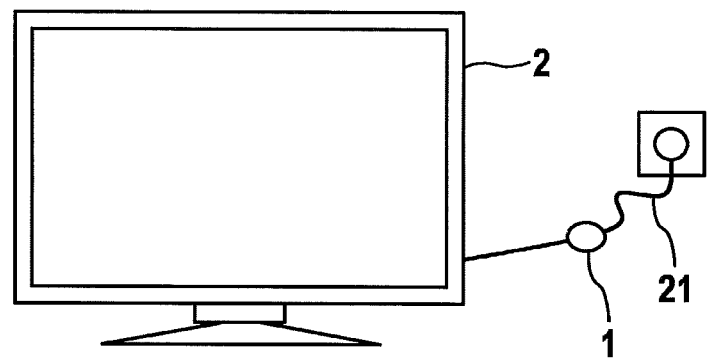
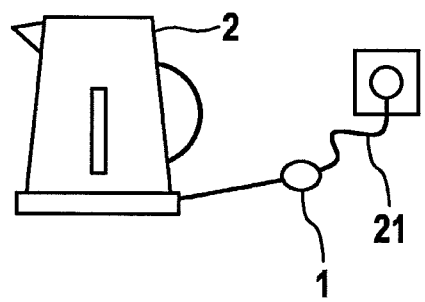
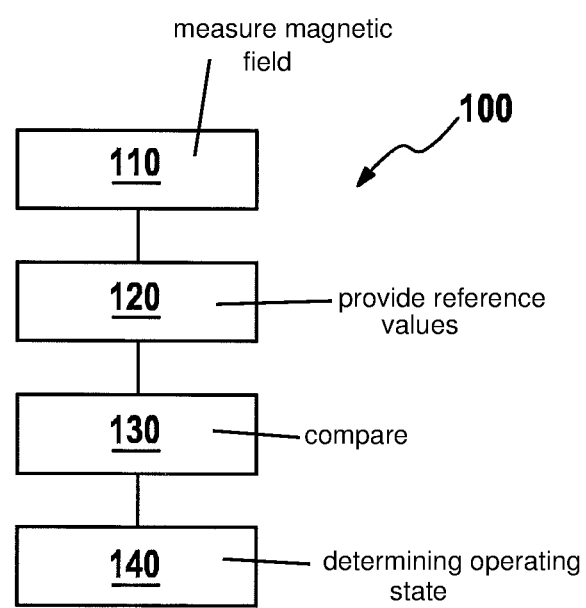
FIG. 3
FIG. 4

DEVICE AND METHOD FOR DETECTING A STATE

FIELD

The present invention relates to a device and a method for detecting a state. The present invention relates especially to a device and a method for detecting a state of an electrical device having a cable connection.

BACKGROUND INFORMATION

The networking of electrical devices within buildings is becoming increasingly important. Systems for monitoring room temperatures, air humidity, water discharge, etc., for example, already exist for this purpose. Several conventional applications automatically transmit measurement data to a power supply company. In addition, some applications already exist which provide for monitoring the activity of a person by analyzing device usage activity. In this regard, it can be monitored whether a kettle, a coffee maker, a washing machine or the like are regularly put into operation, for example. If such a device is not activated for a relatively long period of time, it stands to reason that a person living in such a household has deviated from his/her routine habits and, therefore, can possibly need outside assistance. The electrical devices can be equipped with a radio interface, for example, to monitor the activity of the individual devices to allow them to regularly transmit the instantaneous state thereof to a central location.

Another option for monitoring the activity of an electrical device provides for configuring an additional power meter between the power outlet and the power plug of the electrical device. Such devices can recognize whether a connected electrical device is consuming energy in order to infer therefrom an activity of the electrical device.

European Patent Application No. EP 2 278 344 A2 describes a wireless current sensor for taking indirect measurements using magnetic field sensors. In this regard, a plurality of magnetic field sensors are configured around a power supply cable of an electrical device. These current sensors are configured in an enclosure that can be opened to position the current sensor around the power supply line of the electrical device.

There is, therefore, a need for an inexpensive and energy-efficient state detection for an electrical device having a cable connection. There is also a need for a state detection for an electrical device having a cable connection that allows an uncomplicated operation and is simple to install and use.

SUMMARY

A first aspect of the present invention provides a state detection device of an electrical device having a cable connection and having a magnetic field sensor that is designed for measuring a magnetic field at an electrical power supply cable of the electrical device; a memory that is designed for storing a reference value in each case for a corresponding magnetic field for a plurality of predetermined operating states of the electrical device; and a processing device that is designed for comparing the magnetic field measured by the magnetic field sensor using reference values stored in the memory; and, on the basis of the comparison, for determining an operating state of the electrical device.

Another aspect of the present invention provides a method for detecting a state of an electrical device having a cable connection, including the steps of measuring a magnetic field at an electrical power supply cable of the electrical device; of providing reference values for a plurality of predetermined operating states of the electrical device; of comparing the magnetic field measured by the magnetic field sensor with the reference values provided; and, on the basis of the comparison, of determining an operating state of the electrical device.

According to the present invention, a magnetic field induced by the current flow in a power supply cable of an electrical device is measured using a magnetic field sensor on the power supply cable, and this measured magnetic field is compared with previously determined reference values in order to infer therefrom the active operating state of the electrical device. By comparing the measured field values with previously determined reference values, the state of the electrical device may be readily, rapidly, simply, and thus also cost-effectively determined. Since such a comparison of measured magnetic field values with reference values may be performed very reliably, there is also no need to subject the magnetic field sensor used to stringent requirements. For that reason, an especially low-cost magnetic field sensor may be used, thereby reducing the costs of the overall system correspondingly.

It is also selected from a predetermined number of possible states to determine the operating state of the electrical device. Moreover, since no further intermediate states are permitted, the reliability of a state detection is enhanced, thereby lessening the risk of incorrectly recognized states. Predetermined operating states may be the on and "off" operating states of the electrical device, for example. Other states are also possible, however, provided that they are distinguishable by a characteristic power or current consumption.

A specific embodiment provides that the state detection device also include a calibrating device that is designed for defining a reference value for a predetermined operating state of the electrical device from the magnetic field measured by the magnetic field sensor, and for storing the defined reference value, together with the corresponding state, in the memory. Such a calibration of the state detection makes it possible to individually adapt the state detection to each electrical device to be monitored. In particular, the state monitoring may be hereby adapted very readily to devices having different power consumption rates, without requiring a modification for this in the hardware used. Thus, the state detection device may especially be used universally.

Another specific embodiment provides that the calibrating device be designed for updating the reference values in the memory when the electrical device is in a known operating state, and the corresponding, stored reference value in the memory deviates from the magnetic field instantaneously measured by the magnetic field sensor. This allows the reference values to be regularly updated. It is, therefore, possible to quickly compensate for external disturbances and any influencing of the magnetic field, always making possible a reliable state detection even if the magnetic field at the magnetic field sensor were to change in response to external influences, for example.

Another specific embodiment provides that the calibrating device include an input device that is designed for receiving a user input, the calibrating device being designed for determining a reference value and for storing the defined reference value, together with a corresponding predetermined operating state, in the memory, once the input device has received a user input. This allows an especially simple, manual calibration of the state detection device.

The input device may also have a plurality of input elements, for example, each of these input elements being associated with one of the predetermined operating states. This allows a user, depending on which of these input elements he/she actuates, to also simultaneously signal the momentary operating state of the electrical device to be monitored.

In another specific embodiment, the device also includes a fastening device that is designed for mounting the magnetic field sensor on the electrical power supply cable of the electrical device, a distance between the power supply cable of the electrical device and the magnetic field sensor being adaptable. On the one hand, this allows the magnetic field sensor to be securely mounted at a defined position relative to the power supply cable of the electrical device, thereby enabling the magnetic field to be recorded to be reliably measured as a function of the state. The adaptable distance between the power supply cable and the magnetic field sensor makes it possible for the magnetic field sensor to be mounted in each case relative to the power supply cable in a way that allows the magnetic field sensor to measure an adapted portion of the magnetic field generated by the power supply cable. Thus, the measurement taken by the magnetic field sensor may be adapted to the intensity of the occurring magnetic field. Therefore, the magnetic field sensor only needs a relatively small detection measurement range, thereby allowing the use of relatively inexpensive magnetic field sensors. If the electrical device to be monitored is an electrical device of relatively low power, then only a relatively low magnetic field will occur at the electrical power supply cable. In this case, the magnetic field sensor may be configured relatively closely to the power supply cable. If, on the other hand, an electrical device having a relatively high electric power is being monitored, then a relatively high magnetic field will occur at the power supply cable. In this case, the magnetic field sensor may be positioned farther away from the power supply cable and thereby measures only a relatively small portion of the magnetic field. Here as well, a simple magnetic field sensor may, therefore, be used for relatively weak magnetic fields.

A specific embodiment provides that the fastening device feature a scale that indicates a position of the magnetic field sensor as a function of the power output of the electrical device to be monitored. A user may hereby very readily adjust the magnetic field sensor to the fastening device and thus set an optimal operating point.

In another specific embodiment, the magnetic field sensor is designed for measuring a magnetic field at the power supply cable of the electrical device three-dimensionally. Measuring the magnetic field three-dimensionally in all three spatial directions allows the magnetic field to be recorded very reliably. The magnetic field is thereby preferably analyzed separately in all three spatial directions, thus, in the x direction, y direction and z direction. In this case, separate reference values may also be stored in the memory in each case for the corresponding spatial directions.

In another specific embodiment, the device also includes an interface that is designed for transmitting the state of the electrical device, determined by the processing device, to a receiving device. The interface is preferably a wireless air interface. Such an interface makes it possible for the operating states ascertained by the device to be transmitted for a further processing. An especially efficient analysis of the operating states ascertained by the device is hereby made possible.

Another specific embodiment also provides that the interface be designed for receiving a calibration signal, the calibrating device being designed for determining a reference value and for storing the defined reference value, together with a corresponding predetermined operating state of the electrical device, in the memory, once the interface has received a calibration signal. This enables the process of calibrating the device to be controlled from a remote location by transmitting calibration signals accordingly.

Another aspect of the present invention also provides a building management system having a device according to the present invention for state detection.

BRIEF DESCRIPTION OF THE DRAWINGS

Further specific embodiments and advantages of the present invention are described below with reference to the figures.

FIG. 3 is a schematic view of examples of application of a state detection device in accordance with another exemplary embodiment.

FIG. 4 is a schematic representation of a flow chart for a method for detecting a state, as underlies another exemplary embodiment.

DETAILED DESCRIPTION OF EXAMPLE EMBODIMENTS

Figure 1:
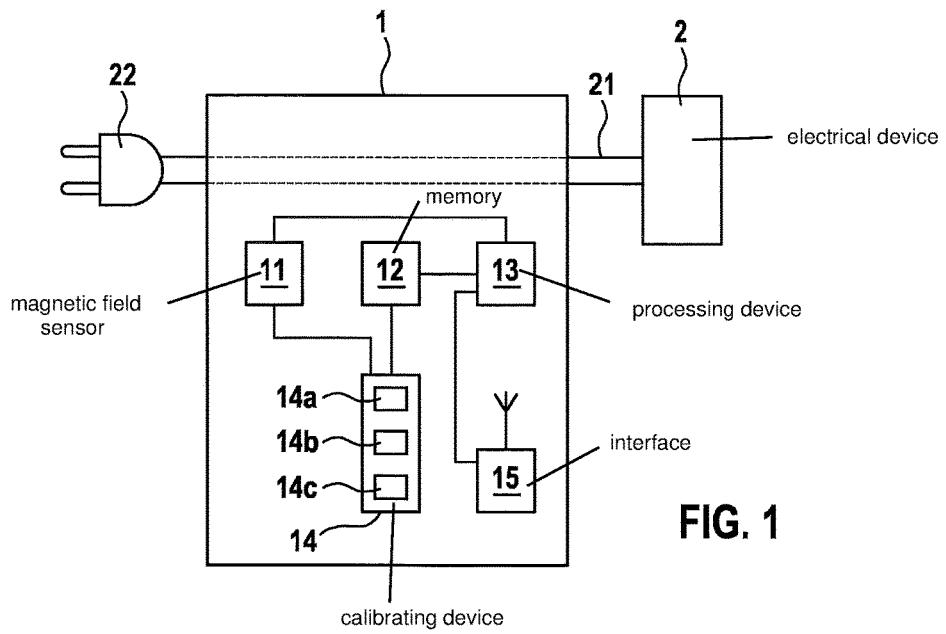
FIG. 1 is a schematic view of a state detection device of an electrical device having a cable connection in accordance with an exemplary embodiment.

FIG. 1 is a schematic view of a state detection device 1 of an electrical device 2 having a cable connection. Electrical device 2 having a cable connection is thereby supplied with electric power via a power supply cable 21. In this regard, power supply cable 21 may have a plug connector 22, for example, it being possible for the electrical device to be connected via plug connector 22 to a corresponding power outlet. A state detection device 1 is thereby mounted on power supply cable 21 between plug connector 22 and electrical device 2. The enclosure of state detection device 1 preferably surrounds a circumference of power supply cable 21 along a portion thereof. To this end, the enclosure of state detection device 1 may be configured as a type of clip or the like. Moreover, other embodiments of the enclosure are similarly possible. State detection device 1 may also have a two-part design, for example, the two parts being joined to one another by a clamp connection, screw connection or similar connection.

State detection device 1 includes a magnetic field sensor 11, a memory 12, a processing device 13, a calibrating device 14, and an interface 15.

If electrical device 2 is active and is thereby supplied with electric power via power supply cable 21, then a magnetic field is generated along power supply cable 21. This magnetic field is measured by magnetic field sensor 11, and a signal corresponding to the recorded magnetic field is transmitted to processing device 13. Magnetic field sensor 11 is preferably one that records the magnetic field that is to be measured three-dimensionally. Thus, such a magnetic field sensor 13 measures magnetic field components in all three spatial directions, thus, in the x direction, y direction and z direction. These individual, measured magnetic field components may also be fed separately to processing device 13.

Reference values for a corresponding magnetic field are stored in memory 12 for each of the possible, predetermined operating states of electrical device 2. The predetermined operating states of electrical device 2 may be the on or "off" operating states, for example. Moreover, other operating states are also possible, provided that they are distinguishable by a characteristic power consumption of electrical device 2. In a specific embodiment, the amount of the active characteristic power or current consumption may thereby be determined from the resulting magnetic field around power supply cable 21. Thus, it may be ascertained, for example, whether a hair dryer or a hot-air ventilator is being operated at reduced power or at full power.

Alternatively, it is also possible to evaluate fluctuations and variations in the power consumption of the electrical device over time and to infer a specific operating state herefrom. Corresponding reference profiles may also be stored in memory 12 that may also be compared with the characteristic curve recorded by magnetic field sensor 11.

If magnetic field sensor 11 is a three-dimensionally measuring magnetic field sensor, reference values may also be stored separately for each of the spatial directions.

Processing device 13 reads the reference values stored in memory 12 and compares them with the magnetic field measured by magnetic field sensor 11. Processing device 13 may be an appropriately designed microprocessor, for example. On the basis of the result of the comparison, processing device 13 determines an active operating state of electrical device 2 to be monitored. Processing device 13 thereby preferably selects that operating state from the set of predetermined operating states stored in memory 12 which has the largest degree of correspondence with the magnetic field instantaneously measured by the magnetic field sensor. The magnetic field monitored by magnetic field sensor 11 may be monitored either for amplitude, frequency, interval from harmonic oscillations, disturbance amplitudes, etc., and compared with corresponding reference values. Magnetic field vectors in space generated by a three-dimensionally measuring magnetic field sensor may also be similarly analyzed.

The operating states of electrical device 2 to be monitored may thereby be periodically evaluated, for example. In this regard, magnetic field sensor 11 may measure the magnetic field around power supply cable 21, in each case at predetermined time intervals, for example, and the active operating states of electrical device 2 to be monitored may then be determined. It is also alternatively possible that the active operating state of electrical device 2 be newly determined only in response to a change in the magnetic field monitored by magnetic field sensor 11. For example, the active operating state may always be newly determined when the magnetic field altogether, or at least one component thereof changes by more than a specific threshold value. Moreover, other event-driven operating state determinations are similarly possible.

The states determined by processing device 13 are transmitted to an interface 15. Interface 15 transmits the state received by processing device 13 to a remote station. This remote station may be a central monitoring or memory unit of a building management system, for example. Also possible is another remote station, such as a processing device at a remote location. Interface 15 is preferably a wireless air interface that transmits the states of electrical device 2 determined by processing device 13 via a wireless link to the remote station. Such a wireless link may be a WLAN connection, a Bluetooth connection, a DECT connection or a further connection in accordance with a known standardized format, or a proprietary communication connection.

The remote station may have a suitable indicator device on which the currently received states of the devices to be monitored are displayed. Additionally or alternatively, the remote station may also feature another communication interface via which a user is able to receive the monitoring results from a remote location. For example, a user may contact the remote station via a smartphone or a computer, for example, a tablet PC to obtain information about the states of the monitored electrical devices.

To determine the reference values for the first time in memory 12 or, in some instances, to update the same, state detection device 1 may update the reference values in memory 12. In this regard, state detection device 1 features a corresponding calibrating device 14. On the basis of the magnetic field currently measured by magnetic field sensor 11, this calibrating device 14 generates corresponding reference values and stores them, together with a suitable, corresponding state, in memory 12. This calibration process may either be carried out manually or automatically.

For example, calibrating device 14 may regularly evaluate the magnetic field values provided by magnetic field sensor 11 and compare them to the active state of electrical device 2 to be monitored. If the instantaneous measurement values of magnetic field sensor 11 thereby deviate from the reference values in memory 12, calibrating device 14 may then generate new reference values accordingly and store them in memory 12. For example, the reference values may be updated in this manner when the reference values in memory 12 deviate by more than a predefined threshold value from the values instantaneously ascertained by calibrating device 14.

A manual calibration is also alternatively possible. In this regard, calibrating device 14 may have one or a plurality of input devices 14a, 14b and 14c. Each of these input devices 14a, 14b and 14c may thereby be assigned to a predetermined operating state of the electrical device to be monitored. For calibration purposes, a user puts electrical device 2 to be monitored in one of the predetermined operating states and, subsequently thereto, actuates corresponding input device 14a, 14b or 14c. Calibrating device 14 then evaluates the magnetic field measured by magnetic field sensor 11, generates corresponding reference values and stores them, together with an indication of the corresponding, predetermined operating state, in memory 12. This process may be carried out separately for each of the predetermined operating states. Once the calibration process has been performed for all of the predetermined states to be recognized, all of the requisite reference values are stored in memory 12, and state detection device 1 may then reliably recognize the operating states of electrical device 2.

Alternatively, a corresponding calibration signal may also be transmitted via interface 15 from the remote station to state detection device 1, and, subsequently thereto, calibrating device 14 may perform a calibration in accordance with the previously described manual concept. Calibration signal received from interface 15 thereby preferably includes an indication of a corresponding, predetermined operating state. The remote station from where calibration signal is transmitted to interface 15 may, in addition, have another device that indicates to the user the operating state in which he/she must put electrical device 2 to be monitored in each particular case.

Figure 2:
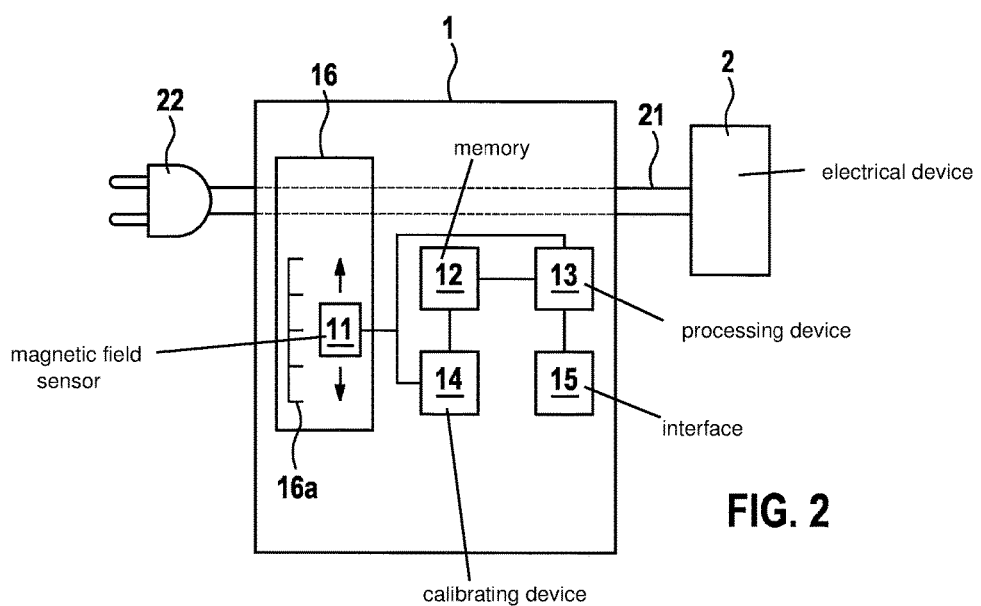
FIG. 2 is a schematic view of a state detection device of an electrical device having a cable connection in accordance with another exemplary embodiment.

FIG. 2 is another schematic view of a state detection device 1 of an electrical device 2 having a cable connection in accordance with another specific embodiment. In this instance, state detection device 1 of this specific embodiment is substantially identical to state detection device 1 of the previously described exemplary embodiment. Here, however, state detection device 1 still includes a fastening device 16 that permits mounting of magnetic field sensor 11 at a variable distance from power supply cable 21. By varying the distance between magnetic field sensor 11 and power supply cable 21, the magnetic field measured by magnetic field sensor 11 may thereby be adapted in a way that allows it to be tailored to the type of magnetic field sensor 11 used. This permits the use of magnetic field sensors having only a relatively small measuring range, for a magnetic field to be measured. If magnetic field sensor 11 is thereby configured close to power supply cable 21, it then measures a substantial portion of the generated magnetic field. Thus, even in the case of electrical devices 2 to be monitored having a relatively low power, the operating states of electrical device 2 may be reliably recognized. If, on the other hand, electrical device 2 to be monitored has a relatively high power consumption, then relatively large magnetic fields are generated along power supply cable 21. In order not to hereby overload magnetic field sensor 11, magnetic field sensor 11 may be positioned farther away from power supply cable 21.

Fastening device 16 for magnetic field sensor 11 may thereby have a scale 16*a* which indicates to a user where he/she should position magnetic field sensor 11 as a function of the power of an electrical device to be monitored. The position of magnetic field sensor 11 may thereby be continuously adjusted between either a minimum and a maximum distance. The position may also be alternatively adjusted in two or more defined steps.

To further adapt the measuring range of magnetic field sensor 11 used to the magnetic field generated along power supply cable 21, state detection device 1 may also have a flux concentrator (not shown) that concentrates or widens the magnetic field generated along power supply cable 21 relative to magnetic field sensor 11 used. Such a flux concentrator may also be configured within state detection device 1 in a way that allows a user to manually adapt the flux concentrator as a function of a magnetic field to be expected.

To further enhance reliability, instead of one single magnetic field sensor 11, a plurality of magnetic field sensors 11 may also be used that are configured symmetrically about power supply cable 21.

FIG. 3 is a schematic view of application cases for a state detection device 1 of electrical devices 2. As is discernible from FIG. 3, electrical devices 2 to be monitored may be any electrical devices. Electrical device 2 may be a television set or a kettle, for example. An iron, a washing machine, a lamp or other electrical devices are likewise possible.

FIG. 4 is a schematic view of a flow chart for a method 100 for detecting a state of an electrical device 2 having a cable connection, as underlies a specific embodiment of the present invention. In a step 110, a magnetic field is measured at electrical power supply cable 21 of an electrical device 2. In addition, in step 120, reference values are provided for a plurality of predetermined operating states of electrical device 2. In step 130, the magnetic field measured by magnetic field sensor 11 is compared to the reference values provided. Finally, on the basis of this comparison, an operating state of electrical device 2 is determined in step 140.

In summary, the present invention relates to a device and a method for detecting a state of an electrical device. A magnetic field is thereby measured by a magnetic field sensor along an electrical power supply cable of the electrical device via which the electrical device is supplied with power, and the magnetic field measured in this manner is compared with previously determined reference values in order to determine the operating state of the electrical device. The process of determining the reference values may thereby be individually adapted in an upstream calibration process to the electrical device to be monitored.

What is claimed is:

1. A device for monitoring a state of an electrical device having a cable connection, comprising:
    a magnetic field sensor to measure a magnetic field at an electrical power supply cable of the electrical device;
    a memory to store reference values, in each case for a corresponding magnetic field, for a plurality of predetermined operating states of the electrical device;
    a processing device to compare the magnetic field measured by the magnetic field sensor with reference values stored in the memory, and determine an operating state of the electrical device based on the comparison; and
    a fastening device to mount the magnetic field sensor on the power supply cable of the electrical device so that a distance between the power supply cable of the electrical device and the magnetic field sensor is adaptable;
    wherein the fastening device permits mounting of the magnetic field sensor at a variable distance from the electrical power supply cable, so that by varying the distance between magnetic field sensor and the electrical power supply cable, the magnetic field measured by the magnetic field sensor is adaptable so that it can be adapted to a type of the magnetic field sensor.

2. The device as recited in claim 1, further comprising:
    a calibrating device to define a reference value for a predetermined operating state of the electrical device from the magnetic field measured by the magnetic field sensor, and to store the defined reference value, together with the corresponding, predetermined state in the memory.

3. The device as recited in claim 2, wherein the calibrating device is to update the reference values in the memory when the electrical device is in a predetermined operating state, and the corresponding, stored reference value in the memory deviates from the magnetic field instantaneously measured by the magnetic field sensor.

4. The device as recited in claim 2, further comprising:
    an input device to receive a user input, wherein the calibrating device is configured to define a reference value and to store the defined reference value, together with a corresponding, predetermined operating state, in the memory once the input device has received a user input.

5. The device as recited claim 2, further comprising:
    an interface to transmit the operating state of the electrical device, determined by the processing device, to a receiving device.

6. The device as recited in claim 5, wherein the interface is additionally configured to receive a calibration signal, the calibrating device being configured to define a reference value and to store the defined reference value, together with a corresponding, predetermined operating state, in the memory once the interface has received a calibration signal.

7. The device as recited in claim 1, wherein the magnetic field sensor is to three-dimensionally measure a magnetic field at the power supply cable of the electrical device.

8. The device as recited in claim 1, wherein the magnetic field sensor is to three-dimensionally measure a magnetic field at the power supply cable of the electrical device by measuring, wherein the magnetic field sensor measures magnetic field components in all three spatial directions, including in an x direction, a y direction and a z direction.

9. The device as recited in claim 1, wherein the fastening device for the magnetic field sensor includes a scale which indicates to a user where to position the magnetic field sensor as a function of the power of an electrical device to be monitored, so that the position of magnetic field sensor is continuously or discretely adjustable between either a minimum distance and a maximum distance.

10. A building management system, comprising:
a device for monitoring a state of an electrical device, including:
a magnetic field sensor to measure a magnetic field at an electrical power supply cable of the electrical device;
a memory to store reference values, in each case for a corresponding magnetic field, for a plurality of predetermined operating states of the electrical device;
a processing device to compare the magnetic field measured by the magnetic field sensor with reference values stored in the memory, and to determine an operating state of the electrical device based on the comparison; and
a fastening device to mount the magnetic field sensor on the power supply cable of the electrical device so that a distance between the power supply cable of the electrical device and the magnetic field sensor is adaptable;
wherein the fastening device permits mounting of the magnetic field sensor at a variable distance from the electrical power supply cable, so that by varying the distance between magnetic field sensor and the electrical power supply cable, the magnetic field measured by the magnetic field sensor is adaptable so that it can be adapted to a type of the magnetic field sensor.

11. The building management system of claim 10, wherein the magnetic field sensor is to three-dimensionally measure a magnetic field at the power supply cable of the electrical device by measuring, wherein the magnetic field sensor measures magnetic field components in all three spatial directions, including in an x direction, a y direction and a z direction.

12. The building management system of claim 10, wherein the fastening device for the magnetic field sensor includes a scale which indicates to a user where to position the magnetic field sensor as a function of the power of an electrical device to be monitored, so that the position of magnetic field sensor is continuously or discretely adjustable between either a minimum distance and a maximum distance.

13. A method for monitoring a state of an electrical device having a cable connection, the method comprising:
measuring, via a magnetic field sensor, a magnetic field at an electrical power supply cable of the electrical device;
providing, via a memory, reference values, in each case for a corresponding magnetic field, for a plurality of predetermined operating states of the electrical device;
comparing, via a processing device, the magnetic field measured by the magnetic field sensor with the reference values provided; and,
determining, via the processing device, an operating state of the electrical device based on the comparison to monitor the state of the electrical device;
wherein the magnetic field sensor is mountable by a fastening device on the power supply cable of the electrical device so that a distance between the power supply cable of the electrical device and the magnetic field sensor is adaptable;
wherein the fastening device permits mounting of the magnetic field sensor at a variable distance from the electrical power supply cable, so that by varying the distance between magnetic field sensor and the electrical power supply cable, the magnetic field measured by the magnetic field sensor is adaptable so that it can be adapted to a type of the magnetic field sensor.

14. The method of claim 13, wherein the magnetic field sensor is to three-dimensionally measure a magnetic field at the power supply cable of the electrical device by measuring, wherein the magnetic field sensor measures magnetic field components in all three spatial directions, including in an x direction, a y direction and a z direction.

15. The method of claim 13, wherein the fastening device for the magnetic field sensor includes a scale which indicates to a user where to position the magnetic field sensor as a function of the power of an electrical device to be monitored, so that the position of magnetic field sensor is continuously or discretely adjustable between either a minimum distance and a maximum distance.

* * * * *